United States Patent [19]

Tanaka et al.

[11] 4,109,157
[45] Aug. 22, 1978

[54] APPARATUS FOR ION-NITRIDING

[75] Inventors: Akio Tanaka, Ono; Mizuo Edamura, Kobe; Satoshi Ruruitsu, Kakogawa; Satoru Kunise, Akashi, all of Japan

[73] Assignee: Kawasaki Jukogyo Kabushiki Kaisha, Kobe, Japan

[21] Appl. No.: 748,453

[22] Filed: Dec. 8, 1976

[30] Foreign Application Priority Data

Dec. 18, 1975 [JP] Japan ............................... 50/152086
Dec. 22, 1975 [JP] Japan ........................... 50/174062[U]

[51] Int. Cl.² .............................................. B01K 1/00
[52] U.S. Cl. ................................. 250/531; 118/49.1; 204/298
[58] Field of Search ....................... 250/531; 118/49.1; 204/298

[56] References Cited

U.S. PATENT DOCUMENTS

| | | |
|---|---|---|
| 3,086,882 | 4/1963 | Smith, Jr. et al. ................. 118/49.1 |
| 3,658,680 | 4/1972 | Combe et al. ..................... 118/49.1 |
| 3,838,028 | 9/1974 | Needham et al. .................... 204/298 |
| 3,916,523 | 11/1975 | Lane et al. ............................ 204/298 |
| 3,968,018 | 7/1976 | Lane et al. ............................ 204/298 |
| 3,981,791 | 9/1976 | Rosvold ............................... 204/298 |
| 4,031,851 | 6/1977 | Camahort ........................... 118/49.1 |

Primary Examiner—Brooks H. Hunt
Attorney, Agent, or Firm—Wenderoth, Lind & Ponack

[57] ABSTRACT

This invention relates to an apparatus for continuous glow discharge nitriding treatment whereby a workpiece is treated while it is being transferred in a vacuum chamber. It comprises a heating means to heat the workpiece up to the suitable temperature at which glow discharge nitriding is going on steadily, a heat-retaining means to keep the heated workpiece at said temperature and a discharge means to carry out discharge nitriding by glow discharge.

5 Claims, 2 Drawing Figures

APPARATUS FOR ION-NITRIDING

BACKGROUND OF THE INVENTION

This invention relates to an apparatus for ion-nitriding treatment, whereby nitrogen gas molecules are ionized by glow discharge and nitrogen ions thus produced are made to collide with a workpiece for nitriding treatment.

DESCRIPTION OF THE PRIOR ART

In the conventional method of ion-nitriding treatment, heat treatment, glow discharge nitriding treatment and cooling treatment are each given independently under the batch system to a workpiece in one metallic receptacle (retort). Therefore, the conventional method requires much time for each cycle of treatments, is low in efficiency and lacks mass-productivity. Moreover, in the heat treatment nitrogen gas molecules are ionized by glow discharge with the workpiece as cathode and a receptacle wall as anode and then the workpiece is heated, while making ions thus produced collide with the workpiece. Accordingly, if a workpiece to be treated is cold at the initial stage of glow discharge nitriding treatment, glow discharge is unstable and local glow discharge is apt to take place, depending upon the surface shape and condition of the workpiece, degree of vacuum, gas atmospheric condition, etc. and in an extreme case, glow discharge shifts to arc discharge and as a result, uniform heating and uniform nitriding treatment of the workpiece cannot be done. Also, in the glow discharge nitriding treatment, it is impossible to keep the whole of workpiece at an accurate temperature suitable for glow discharge nitriding due to local lowering of temperature of the workpiece during treatment and thus the nitriding treatment tends to be more uneven.

SUMMARY OF THE INVENTION

The present invention has for an object to eliminate the above-mentioned defects of the conventional apparatus. According to the present invention, all treating processes including taking-in, heating, discharge nitriding and delivery are carried out on a continuous basis, with improved mass-productivity, namely, while the workpiece to be treated is being transferred in a vacuum chamber, it is heated up to the temperature at which glow discharge nitriding is going on steadily and then is subjected to glow discharge nitriding while it is kept at said temperature.

Another object of the present invention is to provide an apparatus for ion-nitriding, whereby uniform nitriding treatment of a workpiece can be carried out, namely, each of heating, glow discharge nitriding and cooling treatments is carried out independently in a series of sectioned treating chambers. Especially in a discharge nitriding chamber the workpiece is kept heated to the temperature at which glow discharge is going on steadily by heat-retaining means other than glow discharge and is subjected to glow discharge nitriding as, desirably, it is being rotated for uniform nitriding treatment.

BRIEF DESCRIPTION OF THE DRAWINGS

An explanation is made below about preferred embodiments of the present invention, with reference to the attached drawings, in which.

DETAILED DESCRIPTION OF PREFERRED EMBODIMENTS

Embodiment No. 1

Figure 1:
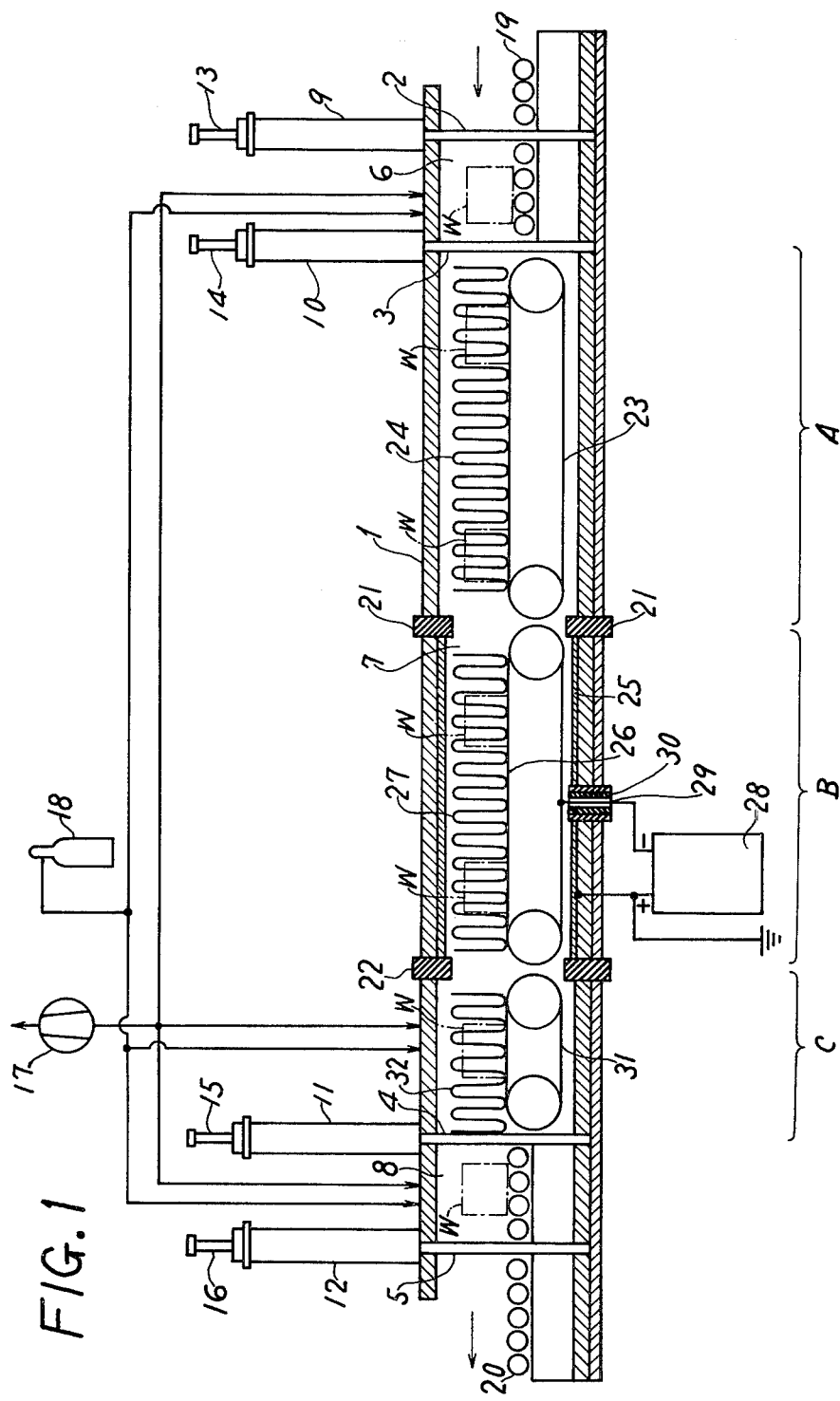
FIG. 1 is a cross sectional side view of Embodiment No. 1.

In FIG. 1, numeral 1 denotes an insulating furnace body of cylindrical shape. It is sectioned into a vacuum regulating chamber 6, a vacuum chamber 7, both being on the taking-in side, and another vacuum regulating chamber 8 on the taking-out side, in the order given, by means of shutters 2, 3, 4 and 5. Numerals 9, 10, 11 and 12 denote respectively oil-pressure or air-pressure cylinders to actuate the shutters 2 - 5. Numerals 13, 14, 15 and 16 are respectively piston rods. Numeral 17 denotes a vacuum pump for the vacuum chamber 7 and both vacuum regulating chambers 6, 8. Numeral 18 denotes a gas bomb to supply nitrogen gas to chambers 6, 7 and 8. (W) is a workpiece to be treated. Numeral 19 denotes a conveyor for carrying in the workpiece (W), and numeral 20 denotes a conveyor for carrying out the treated workpiece (W).

The afore-mentioned vacuum chamber 7 is sectioned into a heating area (A), a discharge nitriding area (B) and a heat-retaining area (C) by insulations 21 and 22 imbedded in the furance body 1. The heating area (A) is provided with a conveyor 23 and a heater 24 to heat the workpiece up to the suitable temperature at which glow discharge is going on steadily. In the discharge nitriding area (B), its furnace wall is lined with an anode plate 25 and a conductive conveyor 26 is provided in connection with the conveyor 23 in the heating area (A). Said conveyor 26 also acts as cathode. And the discharge nitriding area (B) is provided with a heater 27 for heat-retaining, which keeps the workpiece at the temperature suitable for glow discharge nitriding. Numeral 28 denotes a power source controlling device which impresses DC voltage between the anode plate 25 and the cathode (conveyor 26). Numeral 29 denotes a hole to let in a cathode terminal. Numeral 30 is an insulating vacuum sealing material of the cathode terminal. The heat-retaining area (C) is provided with a conveyor 31 connecting with the conveyor 26 in the discharge nitriding area (B) and a heater 32.

A description is made below about the method of treatment by using the apparatus according to the present invention.

The workpiece (W) carried by means of the conveyor 19 is taken in the vacuum chamber 7 via the vacuum regulating chamber 6 on the taking-in side. In this vacuum chamber 7, the workpiece (W) is heated by the heater 24 up to the temperature (350° - 570° C) at which glow discharge nitriding is going on steadily as it is being conveyed by the conveyor 23. Then, in the discharge nitriding area (B), while the workpiece (W) is being kept heated at said temperature by the heater 27 and is being conveyed by the conveyor 26, DC voltage is impressed between the anode plate 25 and the conveyor 26 (cathode) to generate glow discharge on the surface of the workpiece (W), thereby ionizing nitrogen gas molecules for nitriding treatment. In the heat-retaining area (C), the workpiece is conveyed by the conveyor 31 while it is being heated by the heater 32 and is transferred to the vacuum regulating chamber 8 on the taking-out side, from which it is taken out by the conveyor 20.

Embodiment No. 2

Figure 2:
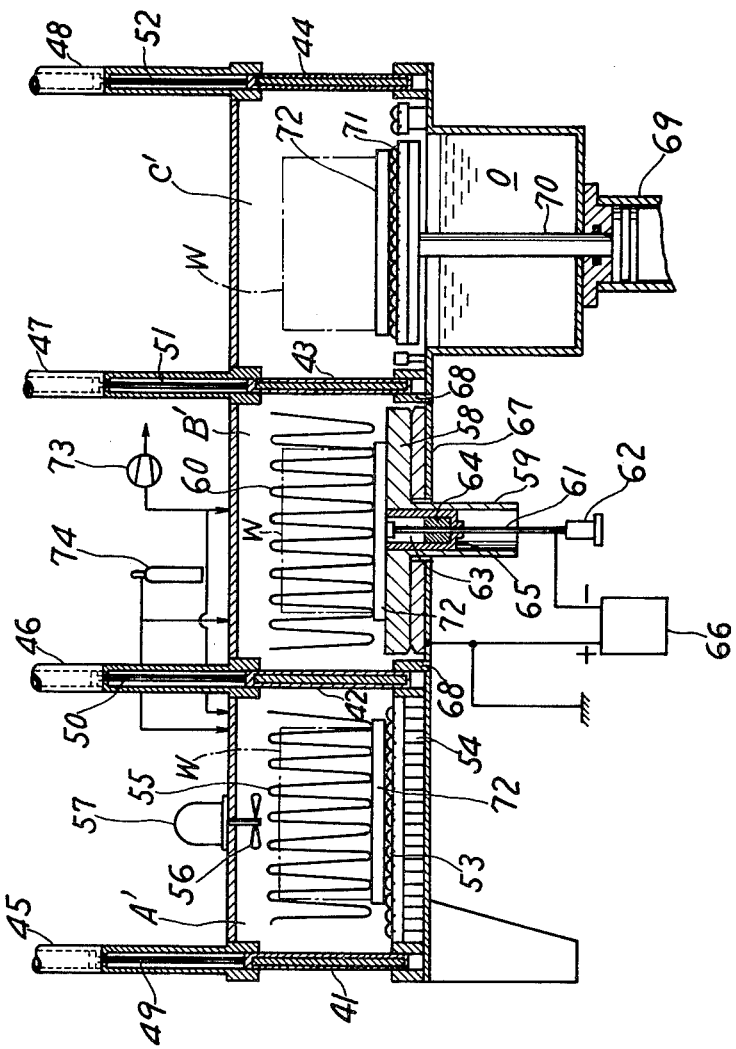
FIG. 2 is a cross sectional side view of Embodiment No. 2

FIG. 2 shows the outline of an apparatus for ion-nitriding whereby heating, glow discharge nitriding and cooling treatments are carried out in sequence. (A') is a heating chamber. (B') is a discharge nitriding chamber. (C') is a cooling chamber. These chambers are arranged in series in the order of (A') – (B') – (C'). Numerals 41 – 44 are partitioning shutters for treating chambers (A'), (B') and (C'). Numerals 45 – 48 are oil-pressure or air-pressure reciprocating cylinders for opening and closing said shutters 41 – 44. Numerals 49 – 52 are piston rods.

In the heating chamber (A'), numeral 53 is a roller conveyor for carrying the workpiece (W). Numeral 54 is a fire-brick floor. Numeral 55 is a heater. Numeral 56 is a fan for circulating heat. Numeral 57 is a motor for the fan.

In the discharge nitriding chamber (B'), numeral 58 denotes an insulating turntable which turns with the workpiece (W) thereon. Numeral 59 is a hollow rotary driving shaft for the turntable 58. Numeral 60 is a heater. Numeral 61 is a cathode terminal which goes up and down in a central hole 63 made in the turntable 58 and in the hollow rotary driving shaft 59 by means of an oil-pressure or air-pressure reciprocating cylinder 62. Numeral 64 is an insulating vacuum sealing material for the cathode terminal 61. Numeral 65 is a cap for holding said vacuum sealing material. Numeral 66 is a power source controlling device for generating glow discharge. The anode terminal of said device 66 is connected to a chamber wall 67 of the discharge nitriding chambers (B') insulated from the other treating chambers (A') and (C'). Numeral 68 is an insulating material.

In the cooling chamber (C'), numeral 69 is an oil-pressure or air-pressure reciprocating cylinder which puts the workpiece (W) in and out of cooling oil (O). Numeral 70 is a piston rod. Numeral 71 is a roller conveyor for transferring the workpiece and is fixed to the top end of said piston rod 70.

Numeral 72 is a heat-electric conductive transferring tray on which the workpiece (W) is placed. Numeral 73 is a vacuum pump. Numeral 74 is a nitrogen gas bomb.

As to the operation of the apparatus, the workpiece (W) placed on the transferring tray 72 is put in the heating chamber (A'); shutters 41 – 44 of treating chambers (A') – (C') are shut; the heating chamber (A') and the discharge nitriding chamber (B') are kept at the degree of vacuum of 5 – 10 Torr by working the vacuum pump 73; the nitrogen gas bomb 74 is opened to fill both treating chambers (A'), (B') with nitrogen gas; the workpiece (W) is uniformly heated up to the temperature (about 350°– 580° C) at which glow discharge nitriding is going on steadily; the shutter 42 is opened and the workpiece (W) placed on the transferring tray 72 is transferred to the discharge nitriding chamber (B') and is placed on the insulating turntable 58. In this discharge nitriding chamber (B'), the cathode terminal 61 is raised to make its end surface contact with the under surface of the transferring tray 72; voltage is impressed simultaneously between the workpiece (W) (cathode) and the chamber wall 67 (anode) by operating the power source controlling device 66 and the workpiece (W) is rotated by working the turntable 58 as it is kept at the temperature suitable for glow discharge nitriding by the heater 60. As a result, uniform glow discharge is generated at the surface of the workpiece (W) which is kept at the uniform temperature and nitrogen gas molecules are ionized for nitriding treatment. With the lapse of the designated time, operation of the power source controlling device 66 is stopped, the shutter 43 is opened by lowering the cathode terminal 61 and the workpiece (W) is transferred onto the roller conveyor 71 of the cooling chamber (C') as it is placed on the transferring tray 72. In this cooling chamber (C'), the workpiece (W) is put in the cooling oil (O) by working the cylinder 69, is cooled down to the designated temperature, is taken out of the cooling oil (O) by working the cylinder 69 and is taken outside after opening the shutter 44.

As to the heater 60 of the above-mentioned discharge nitriding chamber (B'), the resistance heating system, the infrared rays system, etc. are employed, instead of the conventional discharge heating system. The above-mentioned turntable 58 usually makes the workpiece (W) revolve around the table but if it is remodelled into such construction that the workpiece (W) revolves round the table and also on its axis, still more uniform nitriding treatment is made possible, irrespective of complicated shape of the workpiece (W).

According to the present invention, therefore, all the treating processes can be carried out on a continuous basis by heating the workpiece up to the temperature at which glow discharge nitriding is going on steadily, while the workpiece is being conveyed in a vacuum chamber, and by glow discharge nitriding the workpiece while it is kept heated to the suitable temperature at which glow discharge nitriding is going on steadily. Thus, the present invention improves the treating efficiency and also mass-productivity. Moreover, uniform nitriding treatment can be given to the workpiece by heating prior to glow discharge nitriding treatment and heat-retaining during glow discharge nitriding treatment, irrespective of the surface shape and condition of the workpiece, degree of vacuum, gas atmospheric condition, etc.

In the apparatus according to the present invention, as the conveyor in the discharge nitriding area is used as the cathode of glow discharge, transfer of the workpiece and ion-nitriding treatment of the workpiece can be carried out simultaneously, with the result of simplification of its construction. Futhermore, in the apparatus of the present invention, the workpiece to be treated is pre-heated in the heating chamber, prior to glow discharge nitriding treatment, to the temperature most suitable for glow discharge nitriding treatment and therefore the apparatus has such advantages that glow discharge efficiency of the workpiece to be treated is better and more stabilized glow discharge can be generated even at the initial stage, uniform nitriding treatment can be finished in a short time and control of glow discharge can be exercised with ease. In addition, since the discharge nitriding is effected while the workpiece is kept heated at the temperature most suitable for glow discharge nitriding and is being rotated, the nitriding treatment is still more improved in uniformity, and treating time can be reduced even further. Furthermore, by providing the heating chamber, discharge treating chamber and cooling chamber in a series and by making each of the chambers independent by means of shutters, the apparatus according to the present invention is superior in efficiency and mass-productivity to the conventional apparatus in which the above-mentioned three processes are effected in a single treating chamber.

The apparatus according to the present invention has further advantages as mentioned below. Since the workpiece is transferred in each treating chamber as it is placed on the transferring tray, it is free from being damaged. The cathode terminal may be of the fixed type, but if it is made to go up and down in relation to the transferring tray as mentioned above, the cathode terminal is free from being damaged by the motion of the transferring tray by setting it downward while the transferring tray is moving. Moreover, by making the cathode terminal stick fast to the transferring tray at a given pressure by the cylinder, discharge at the contact point of the two can be prevented, with resultant improvement of durability of the cathode terminal. Futhermore, by providing vacuum regulating chambers on the taking-in side and at the taking-out side in connection with each other at the front and the rear of the vacuum chamber by means of shutters, the vacuum chamber is prevented from being opened directly to the atmosphere when taking the workpiece in or out, with the result that the lowering of the degree of vacuum of the vacuum chamber is reduced and vacuum suctioning time can be shortened.

What is claimed is:

1. An apparatus for ion-nitriding comprising:
   (a) a vacuum chamber sectioned into a heating area having insulating chamber walls and a discharge nitriding area having electrically conductive chamber walls;
   (b) a first transferring means disposed in said heating area for transferring a workpiece;
   (c) heating means disposed in said heating area for pre-heating the workpiece up to the temperature at which the workpiece can be glow discharge nitrided;
   (d) electrically conductive transferring means disposed in said discharge nitriding area for receiving the pre-heated workpiece from said first transferring means;
   (e) heat-retaining means disposed in said discharge nitriding area for maintaining the pre-heated workpiece at a temperature suitable for glow discharge nitriding; and
   (f) discharge means to generate glow discharge between said conductive chamber wall of said discharge nitriding area as anode and said electrically conductive transferring means as cathode.

2. An apparatus as recited in claim 1, further comprising:
   (a) a cooling area provided adjacent the rear part of the vacuum chamber for cooling the workpiece subjected to glow discharge nitriding; and
   (b) shutters disposed as partitions between the heating area and the discharge nitriding area, and between the discharge nitriding area and the cooling area.

3. An apparatus as recited in claim 1, further comprising:
   a vacuum regulating chamber for taking in the workpiece and a vacuum regulating chamber for taking out the workpiece, provided in front of and at the rear of the vacuum chamber respectively, with shutters being disposed to partition each vacuum regulating chamber from said vacuum chamber.

4. An apparatus as recited in claim 1, further comprising:
   a source of nitrogen gas and a means for supplying the nitrogen gas to the discharge nitriding area.

5. An apparatus as recited in claim 1, further comprising:
   rotating means provided in the discharge nitriding area for supporting and rotating the electrically conductive transferring means.

* * * * *